(12) United States Patent
Kim et al.

(10) Patent No.: US 6,323,664 B1
(45) Date of Patent: Nov. 27, 2001

(54) SEMICONDUCTOR MEMORY DEVICE CAPABLE OF ACCURATELY TESTING FOR DEFECTIVE MEMORY CELLS AT A WAFER LEVEL

(75) Inventors: Sung-Hoon Kim, Kuro-ku; Chul-Soo Kim, Suown, both of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/620,018

(22) Filed: Jul. 20, 2000

(30) Foreign Application Priority Data

Jul. 22, 1999 (KR) .................................................. 99-29785

(51) Int. Cl.[7] .................................................. G01R 31/02
(52) U.S. Cl. .......................... 324/754; 324/765; 714/720; 365/201
(58) Field of Search .................................. 324/754, 765; 714/718, 719, 720; 365/201

(56) References Cited

U.S. PATENT DOCUMENTS

| | | | |
|---|---|---|---|
| 5,617,531 | * 4/1997 | Crouch et al. | 714/30 |
| 5,666,049 | * 9/1997 | Yamada et al. | 324/158.1 |
| 5,986,320 | * 11/1999 | Kawano | 257/529 |
| 6,065,143 | * 5/2000 | Yamasaki et al. | 714/720 |

* cited by examiner

Primary Examiner—Hoai V. Ho
(74) Attorney, Agent, or Firm—Marger Johnson & McCollom, P.C.

(57) ABSTRACT

Disclosed herein is a semiconductor memory device that includes a memory cell array and a plurality of pads for providing data to and from the memory cell array. A plurality of input/output line pairs corresponds to the plurality of pads. A reading means reads out the data from the memory cell array through the plurality of input/output line pairs and pads. A switch control circuit generates sequential switch control signals during a test mode. A switch control means receives the data from the reading means during the test mode. The switching means sequentially transfers the data to a representative pad responsive to the switch control signals. The present invention allows testing for defective memory cells at a wafer level using a limited number of probe needles.

15 Claims, 4 Drawing Sheets

SEMICONDUCTOR MEMORY DEVICE CAPABLE OF ACCURATELY TESTING FOR DEFECTIVE MEMORY CELLS AT A WAFER LEVEL

FIELD OF THE INVENTION

The present invention relates to semiconductor integrated circuits and more particularly to a semiconductor memory device that is capable of accurately testing for defective memory cells at a wafer level.

BACKGROUND OF THE INVENTION

The manufacture of semiconductor integrated circuits entails a multitude of processes including design, manufacture, packing, and test. Testing is divided into functional, parametric, and bum-in methodologies. In each of these regimes,the devices may be tested in wafer, die, or packaged foam. Although packaging is a comparatively expensive step, semiconductor manufacturers often package the devices before testing, that is, prior to ensuring proper device operation. The high cost of packaging devices. coupled with the increased complexity of the device structures has forced manufacturers to test the devices before packaging, in wafer or die foam. By doing so, the probability of packaging non-operational devices is decreased. Further, with the advent of multichip modules, wafer or die level testing is required since the semiconductor device is only one of several components mounted on a multichip carrier.

A fixed probe board for testing semiconductor wafer chips was disclosed by Hasegawa in U.S. Pat. No. 4,567,640 titled FIXED PROBE BOARD. The Hasagawa probe board comprises a plurality of probe needles mounted to a Support base. The configuration of the probe needles matches an array of pads (for example, pads for data input/output, pads for control signals, pads for addresses, and pads for command) of the integrated circuit to be tested. The probe board disclosed in the '640 patent is impractical for parallel testing plural semiconductor integrated circuits (for example, integrated circuits arranged in an identical row or column) in die or wafer form (hereinafter, referred to as "parallel test").

The parallel test is limited by the number of probe needles that are assigned to each of semiconductor integrated circuits under simultaneous test. This is because probe needles of a probe card (corresponding to the probe board) must be arranged within an area of a memory device under test without being arranged within an area of an adjacent memory device. It becomes difficult to allot the probe needles of the probe card so as to correspond to pads of a tested memory device, particularly data input/output pads (hereinafter, referred to as DQ pads). The number of probe needles allotted to a single device is reduced as the number of devices tested simultaneously. Conversely, as more devices are simultaneously tested, fewer needles are assigned to test a single device.

The parallel test at a wafer level is performed as follows. First, the DQ pads of the device under test, e.g., a memory device, are divided into a plurality of groups. A probe needle is assigned to a single DQ pad in each group. The selected DQ pad is termed a representative DQ pad. Data is then written via the representative DQ pads of each of the semiconductor integrated circuit memory devices under simultaneous test. At this time, data inputted via the representative DQ pad is commonly provided into tile other DQ pads. Data bits are read out from memory cells of the respective memory devices under test. Data bits, corresponding to each group, for example, two data bits, are compared to determine whether the bits have the same logic state. The result of the comparison is outputted via the representative DQ pad. The result of the comparison determines whether memory cells are present or absent, that is, normal or defective. respectively.

The above-described test scheme has the following disadvantage. Where all logic states of data bits corresponding to DQ pads of a group are inverted, it is impossible to determine defective memory cells corresponding to the DQ pads of the group. This is because all the data bits corresponding to the DQ pads of the group have the same logic states. This problem becomes more serious as the number of DQ pads (for example, DQ pads corresponding to the bit organization, x16, x32, x64, etc.) integrated in the memory device increases.

SUMMARY OF THE INVENTION

It is an object of the present invention to overcome all of the disadvantages associated with prior art semiconductor devices.

It is another object of the present invention to provide a semiconductor memory device that is capable of accurately testing for defective memory cells at a wafer lc,cl using a limited number of probe needles.

A semiconductor memory device is provided to achieve the above-described objects. The device comprises a memory cell array for storing data bit information and a plurality of pads for providing data to and from the memory cell array. A plurality of input/output line pairs corresponds to the plurality of pads. Reading means read out the data from the memory cell array through the plurality of input/output line pairs and pads. Switch control means generate sequential switch control signals during a test mode and switching means receive the data from the read means and sequentially transfer the data to a representative pad responsive to the sequential switch control signals.

The switch control means is preferably a mode register set circuit.

The representative pad is electrically coupled to a probe needle mounted to a probe card during the test mode while remaining pads are electrically decoupled from the probe card during the test mode.

A writing means writes the data to the memory cell array through the plurality of input/output line pairs and pads.

The test mode is performed at a wafer level.

The device further comprises a plurality of output buffers. Each output buffer buffers the data received from the switching means and providing it to a corresponding pad.

BRIEF DESCRIPTION OF THE DRAWINGS

The foregoing and other objects, features, and advantages of the invention will become more readily apparent from the following detailed description of a preferred embodiment that proceeds with relevance to the following drawings.

DESCRIPTION OF THE PREFERRED EMBODIMENT

Figure 1:
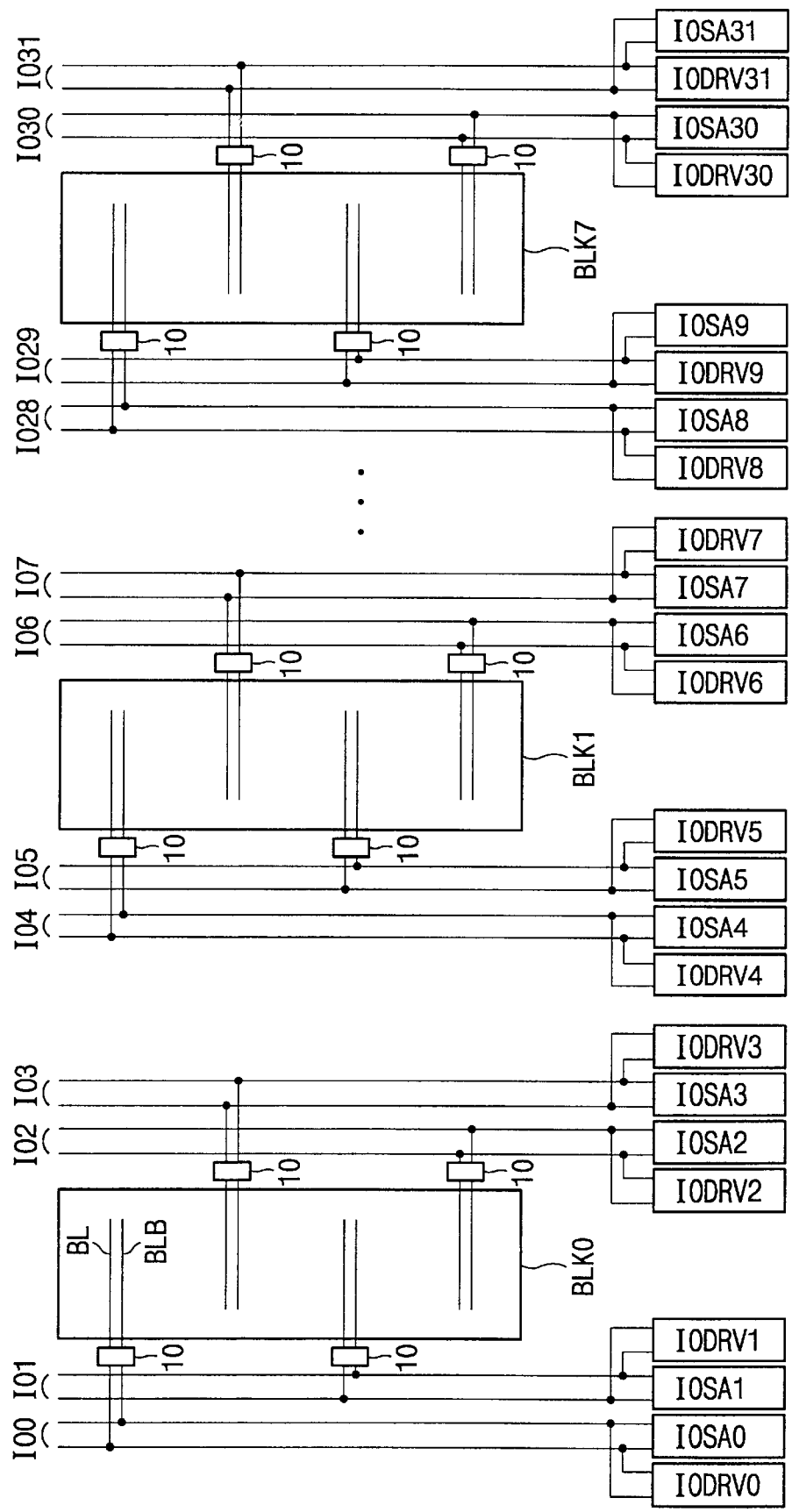
FIG. 1 is a block diagram of a semiconductor integrated circuit memory device according to the present invention.

Referring to FIG. 1, a block diagram of a semiconductor integrated circuit memory device (for example, DRAM) according to the present invention. The device of the present invention will be described under the assumption that its bit organization is x32. This means that 32 DQ pads for data input and output are provided in the memory device. A person skilled in the art will recognize that other bit-organizations, e.g., x16 and x64, come within the scope and spirit of the present invention.

The memory device includes a memory cell array (or bank) for storing information of data bits, which, for example, is divided into plural memory blocks arranged in first direction. For the convenience of drawing, eight memory blocks BLK0_BLK7 are illustrated. At a right side of each memory block are two pairs of input/output lines arranged in a second direction perpendicular to the first direction. Similarly, at a left side of each memory block are two pairs of input/output lines arranged in the second direction. For example, two input/output line pairs IO0 and IO1 are arranged at the left side of a memory block BLK0 and two input/output line pairs IO2 and IO3 are arranged at the right side of the memory block BLK0.

As illustrated in FIG. 1, input/output drivers IODRV0~OIODRV31 and input/input sense amplifiers IOSA0~OOSA31 are coupled to one ends of corresponding input/output line pairs IO0~IO31. Each of the input/output drivers IODRV0~OIDRV31 receives data and drives the corresponding input/output line pair. The respective input/output line pairs IO0~I)31 are coupled to corresponding bit line pairs BL and BLB via corresponding bit line sense amplifier (not shown) & column gate 10 (hereinafter, referred to as BLSA & Y-gate) In this manner, data is transferred to corresponding memory blocks BLK0~BLK7. Written data to the respective memory block BLK0~BLK7 is sensed by the input/output sense amplifiers IOSA0~OISA31 via sense amplifier & column gate 10 and input/output line pairs IO0~IO31 in accordance with a well-known read operation.

Read means comprises the input/output sense amplifier and the BLSA & Y-gate corresponding to each input/output line pair. Write means comprises the input-output driver and the BLSA & Y-gate corresponding to each input/output line pair.

Figure 2:
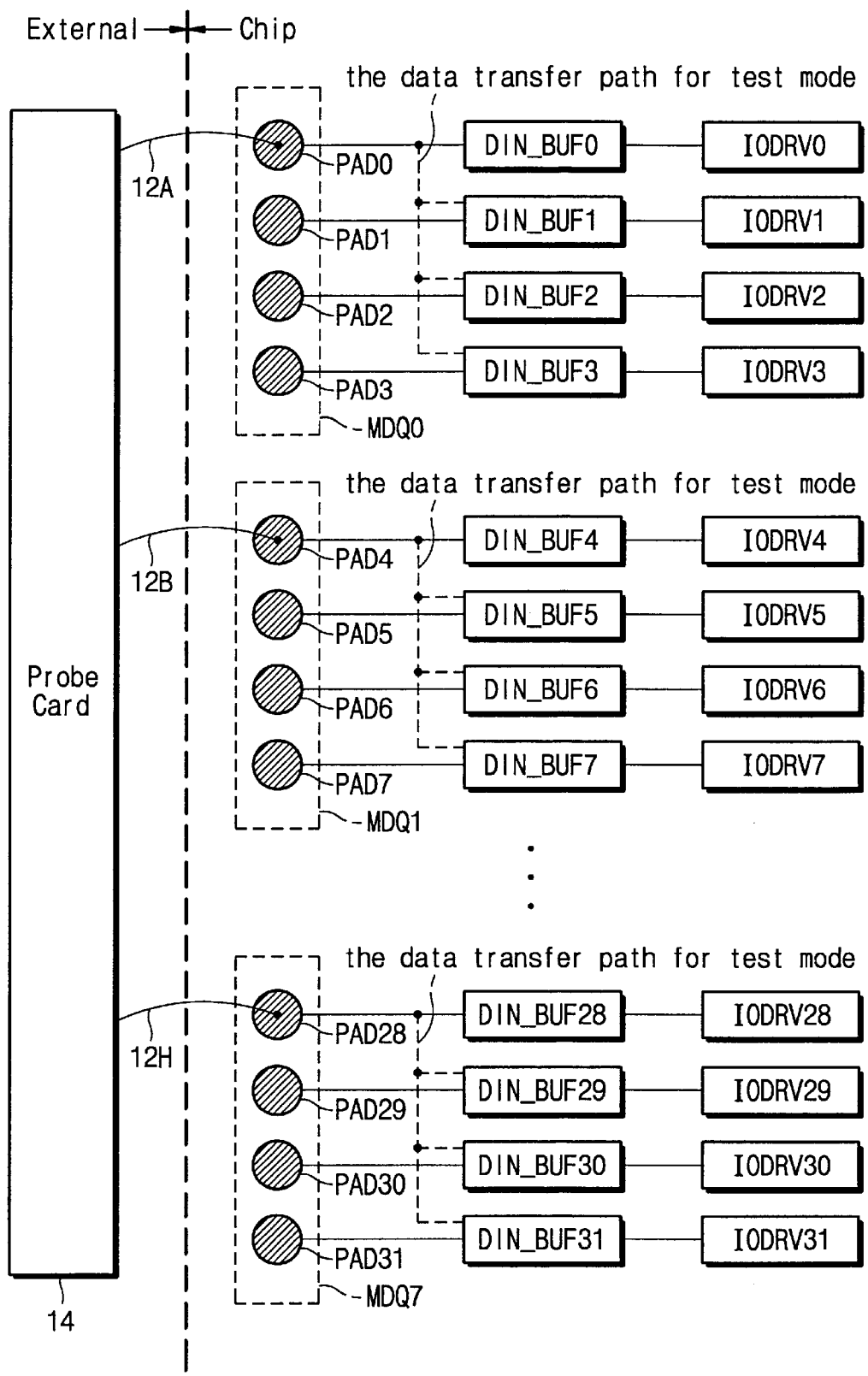
FIG. 2 is a block diagram of the connection between DQ pads, data input buffers and input/output drivers associated with a parallel test write operation in accordance with the present invention.

FIG. 2 is a block diagram showing the connection of DQ pads, data input buffers, and input/output drivers associated with parallel test write operation according to the present invention. Since the bit organization of the memory device undergoing the parallel test is x32, to the memory device is provided with 32 DQ pads PAD0_PAD31. For the convenience of drawing, the pads are arranged contiguously along a side of the memory device. However, it should be obvious to a person skilled in the art that the pads might be arranged in other configurations.

The 32 DQ pads PAD0~PAD31 are divided into eight groups MDQ0~MDQ7 each of which includes 4 DQ pads. One representative DQ pad of the 4 DQ pads of each group MDQ0~MDQ7 is electrically coupled to the probe card 14 via an assigned probe needle e.g. needles 12A, 12B, . . . , 12H, as illustrated in FIG. 2. For example, the representative DQ pad of the group MDQ0 is PAD0 and the representative DQ pad of the group MDQ1 is PAD4. Therefore, the representative DQ pads of the 32 DQ pads are PAD0, PAD4, . . . , PAD28. Thus, eight representative DQ pads PAD0, PAD4, . . . , PAD28 are coupled to the probe card 14 via corresponding probe needles 12A, 12B, . . . , 12H.

The DQ pads PAD0~PAD31 are connected to corresponding data input buffers DIN_BUF0~DIN_BUF31. The data input buffers DIN_BUF0~DIN_BUF31 receive and latch data bits to be written to the memory cell array through corresponding DQ pads PAD0~PAD31 during a typical write operation. The input/output drivers IODRV0~IODRV31 corresponding to the DQ pads PAD0~PAD31 receive data bits from corresponding buffers DIN_BUF0~DIN_BUF31 and then drive corresponding input/output line pairs IO0~IO31.

In such a DQ pad and buffer configuration, during a parallel test write operation performed at the wafer level, the representative DQ pads PAD0, PAD4, . . . , PAD28 are coupled to the probe card 14 through the corresponding assigned probe needles 12A, 12B, . . . , 12H. It can be seen from the drawing that no probe needles are assigned to non-representative DQ pads of each group MDQ0~MDQ7. Data bits to be written in the memory cell array of the memory device under test are provided to the representative DQ pads PAD0, PAD4, . . . , PAD28 from the probe card 14 through corresponding probe needles 12A, 12B, . . . , 12H. The data bits thus provided are transferred to other data input buffers of each group as well as corresponding data input buffers of each group. For example, a data bit (logic "1" or logic "0") is provided to the representative DQ pad PAD0 of the group MDQ0. This data bit is transferred not only to corresponding data input buffer DIN_BUF0 but also to the remaining data input buffers DIN_BUF1~IN_BUF3 via a transfer path illustrated by the dotted line in FIG. 2. As a result, input/output line pairs corresponding to DQ pads of each group MDQ0~MDQ7 are driven by corresponding input/output drivers at the same logic state, respectively. Data bits of input/output line pairs thus driven are transferred (or written) to corresponding memory blocks BLK0~BLK31 in the same manner as described above.

Figure 3:
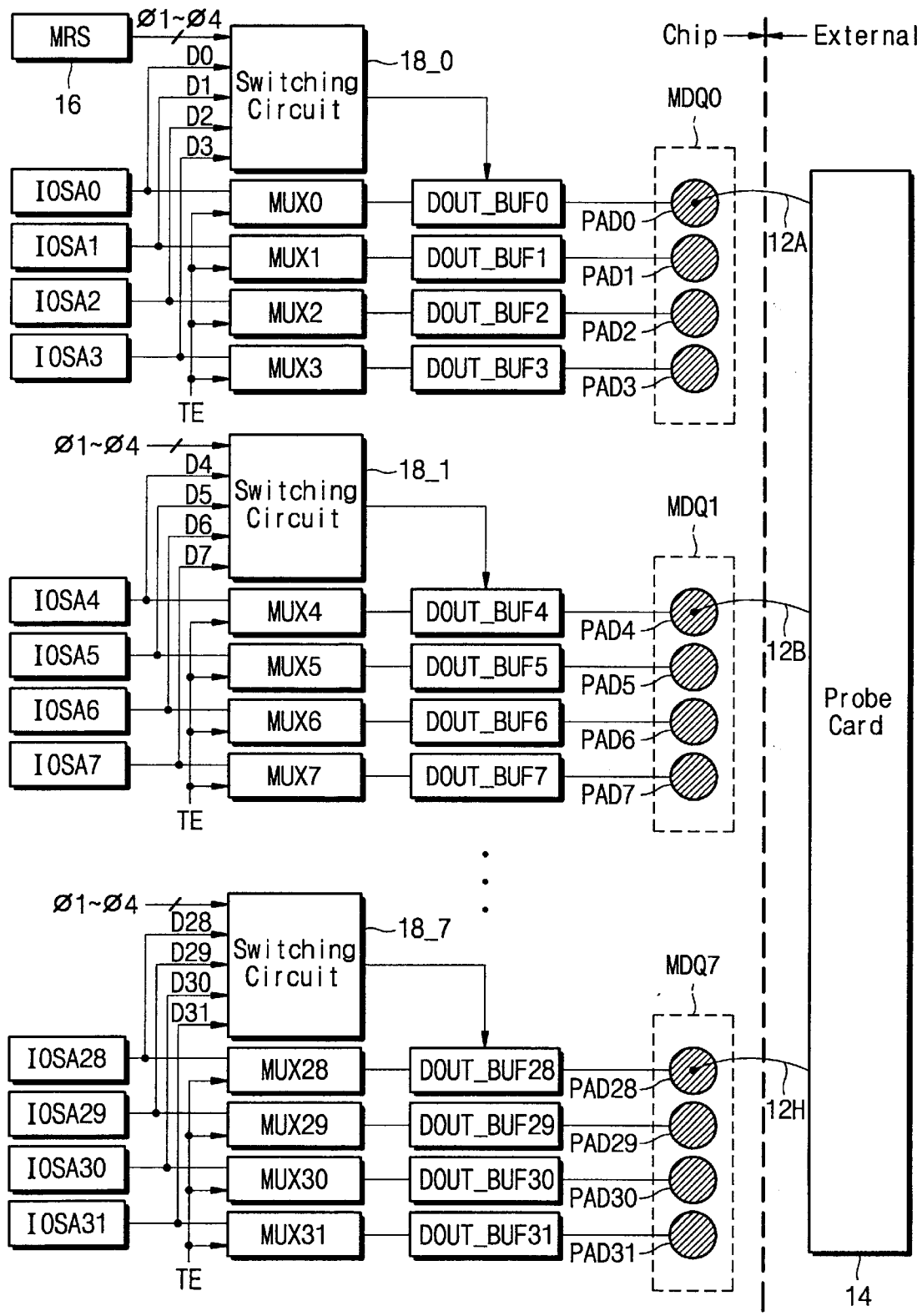
FIG. 3 is a block diagram of the circuit configuration associated with a parallel test read operation in accordance with the present invention.

A block diagram showing the circuit configuration associated with the parallel test read operation performed at the wafer level in accordance with the present invention is illustrated in FIG. 3. Referring to FIG. 3, the semiconductor memory device includes 32 data output buffers DOUT_BUF0~DOUT_BUF31 connected to the DQ pads PAD0~PAD31. The data output buffers OUT_BUF0~DOUT_BUF31 are coupled to corresponding input sense amplifiers IOSA0~IOSA31 via corresponding multiplexers MUX0~MUX31, respectively. According to this arrangement, during a typical read operation, data bits read out via the input/output sense amplifiers IOSA0~OIOSA31 are transferred to corresponding DQ pads PAD0~PAD31 through corresponding multiplexers MUX0~MUX31 and data output buffers DOUT_BUF0~DOUT_BUF31.

When performing the parallel test at the wafer level, transfer paths of the multiplexers MUX0_MUX31 are broken by the signal TE. The signal TE is used to indicate a parallel test.

The semiconductor memory device of the present invention further includes a mode register set (MRS) circuit 16, as illustrated in FIG. 3. The MRS circuit 16 generates first to fourth switch control signals $\phi 1$~$\phi 4$. The first to fourth switch control signals $\phi 1$~$\phi 4$ are sequentially activated during the parallel test at the wafer level. The switch control signals $\phi 1$~$\phi 4$ are alternatively provided external to the device using other pads not used normally for the memory device or dummy pads.

Figure 4:
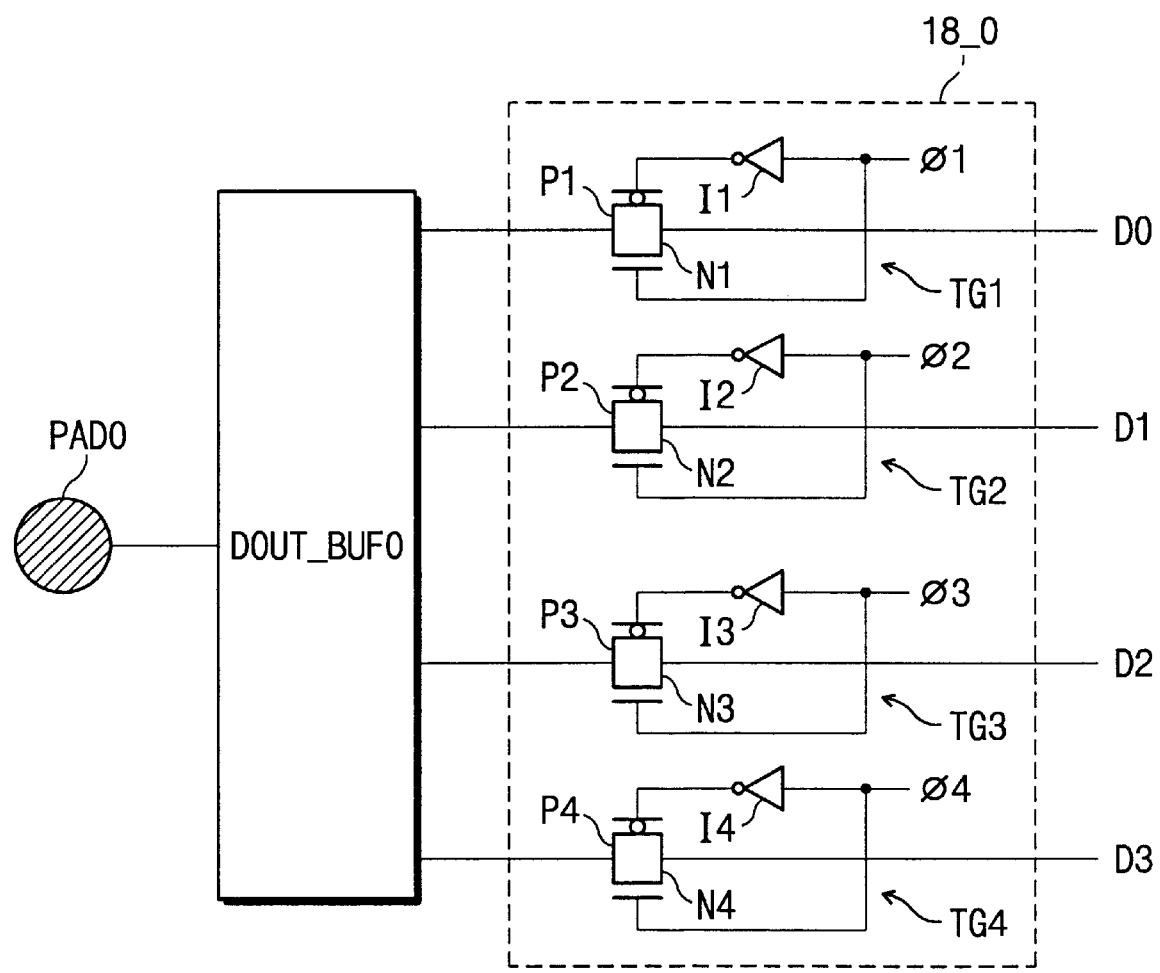
FIG. 4 is a diagram of a preffered embodiment of the switch circuit in FIG. 3.

Continuing to refer to FIG. 3, switch circuits 18_0_18_7 the groups MDQO_MDQ7. Each switch circuit 18_0_18_7 receives data bits from corresponding input/output sense amplifiers. The data bits received in each switching circuit are sequentially transferred to corresponding representative DQ pads via corresponding data output buffers responsive to the first to fourth switch control signals $\phi 1 - \phi 4$, respectively. A preferred embodiment of the switch circuit 18_0 is illustrated in FIG. 4. The switch circuits 18_1_18_7 are configured similarly to switch circuit 18_0 shown in FIG. 4. The switch circuit 18_0 includes four transfer gates TG ITG4. Each transfer gate includes a PMOS transistor, an NMOS transistor, and an inverter connected as illustrated in FIG. 4.

When the switch control signal $\phi 1$ from the MRS circuit 16 is high, the PMOS transistor and the NMOS transistor N1 are turned on to establish the path of the transfer gate TG1. A data bit D0 from the sense amplifier IOAS0 is transferred to the representative DQ pad PAD0 through the data output buffer DOUT_BUF0. At this time, since remaining switch control signals $\phi 2 - \phi 4$ are maintained low, the paths of the transfer gates TG2~TG4 are not established. When the switch control signal $\phi 2$ from the MRS circuit 16 is high, the PMOS transistor P2 and the NMOS transistor N2 are turned on to establish path of the transfer gate TG2. A data bit DI from the sense amplifier IOSAI is transferred to the representative DQ pad PAD0 through the data output buffer DOUT_BUF0. Remaining data bits are also transferred to the representative DQ pad PAD0 in the same manner as described above. Similarly, data bits corresponding to remaining groups are sequentially outputted via a corresponding switch circuit, data output buffer, and representative DQ pad. Therefore, data bits of the respective groups are sequentially transferred to the representative DQ pads PAD0, PAD4, . . . , PAD28 of the groups MDQ0~MDQ7 through corresponding switch circuits 18_0~18_7.

The present invention allows testing of semiconductor memory devices at a wafer level using only a limited number of probe needles and DQ pads. The present invention identifies defective memory cells by detecting their presence or absence.

Although the logic states of data bits read out via input/output sense amplifiers corresponding to arbitrary groups are changed against their original logic states, the defective memory cells are properly identified. The semiconductor memory device according to the present invention is particularly useful in the die field because the defective cells are identified before packaging improving yield and, ultimately, reducing costs.

Having illustrated and described the principles of my invention in a preferred embodiment thereof, it should be readily apparent to those skilled in the art that the invention can be modified in arrangement and detail without departing from such principles. We claim all modifications coming within the spirit and scope of the accompanying claims.

Claimed is:

1. A semiconductor memory device, comprising:
   a memory cell array;
   a plurality of pads for providing data to and from the memory cell array;
   a plurality of input/output line pairs corresponding to the plurality of pads intersecting a corresponding plurality of bit lines;
   reading means for reading out the data from the memory cell array through the plurality of input/output line pairs and pads;
   switch control means for generating sequential switch control signals during a test mode; and
   switching means for receiving the data from the read means and sequentially transferring the data to a representative pad responsive to the sequential switch control signals, the representative pad being electrically coupled to a probe needle on a probe card during the test mode while remaining pads arc not electrically coupled to the probe card during the test mode.

2. The semiconductor memory device of claim 1 wherein the switch control means is a mode register set circuit.

3. The semiconductor memory device of claim 1 comprising writing means for writing the data to the memory cell array through the plurality of input/output line pairs and pads.

4. The semiconductor memory device of claim 1 wherein the test mode is performed at a wafer level.

5. The semiconductor memory device of claim 1 including a plurality of output buffers, each output buffer buffering the data received from the switching means and providing it to a corresponding pad.

6. A semiconductor memory device, comprising:
   a memory cell array;
   a plurality of pads divided into groups;
   a plurality of input/output line pairs corresponding to the plurality of pads arranged to intersect a corresponding plurality of bit lines;
   a plurality of input/output sense amplifiers coupled to the input/output line pairs, each sense amplifier reading data from the memory cell array via a corresponding input/output line pair;
   a plurality of output buffers corresponding to the plurality of pads, each output buffer receiving the data from a corresponding sense amplifier and transferring the data to a corresponding pad;
   a switch control circuit for generating sequential control signals during a test mode;
   a switch circuit including a plurality of switching sections corresponding to the plurality of pads, each switching section sequentially transferring the data from a corresponding output buffer to a representative pad responsive to the sequential control signals during the test mode.

7. The semiconductor memory device of claim 6 wherein the switch control circuit comprises a mode register set circuit.

8. The semiconductor memory device of claim 6 wherein the representative pad is electrically coupled to a probe needle mounted on a probe card during the test mode while remaining pads are not electrically coupled to the probe card during the test mode.

9. The semiconductor memory device of claim 6 comprising:
   a plurality of data input buffers corresponding to the plurality of pads, the plurality of data input buffers receiving the data during the test mode; and
   a plurality of input/output drivers corresponding to the plurality of data input buffers, the plurality of input/output drivers transferring the data from corresponding input buffers via corresponding input/output line pairs.

10. A semiconductor memory device, comprising:
    a plurality of pads divided into a plurality of groups, each group having arepresentative pad;
    a plurality of buffers corresponding to the plurality of pads for buffering data to and from a memory cell array;

a control circuit for generating sequential control signals; and a switching circuit for sequentially coupling the representative pad to one of the plurality of buffers responsive to the sequential control signals.

11. The semiconductor memory device of claim 10 wherein the plurality of buffers includes input buffers for buffering data to be written to the memory cell array.

12. The semiconductor memory device of claim 11 wherein the plurality of buffers includes output buffers for buffering data to be read out from the memory cell array.

13. The semiconductor memory device of claim 10 wherein the control circuit is a mode register set circuit.

14. The semiconductor memory device of claim 10 wherein the switching circuit comprises a plurality of transfer gates, each transfer gate transferring data to and from a corresponding buffer.

15. The semiconductor memory device of claim 14 wherein each transfer gate comprises:

an inverter for receiving a corresponding control signal;

a first transistor connected to the inverter; and a second transistor connected in parallel to the first transistor.

* * * * *

UNITED STATES PATENT AND TRADEMARK OFFICE
CERTIFICATE OF CORRECTION

PATENT NO. : 6,323,664 B1
DATED : November 27, 2001
INVENTOR(S) : Kim et al.

It is certified that error appears in the above-identified patent and that said Letters Patent is hereby corrected as shown below:

Column 1,
Line 16, "bum-in" should read -- burn-in --.
Line 21, "devices." should read -- devices, --.
Line 24, "foam" should read -- form --.
Line 65, "tile" should read -- the --.

Column 2,
Line 6, "defective. respectively." should read -- defective, respectively. --
Line 25, "lc,cl" should read -- level --.

Column 3,
Line 21, "arc" should read -- are --.
Lines 20, 25 and 27, "BLKO" should read -- BLK0 --.
Line 30, "OIODRV31" should read -- IODRV31 --.
Line 31, "OOSA31" should read -- IOSA31 --.
Line 32, "OIDRV31" should read -- IODRV31 --.
Line 34, "I )31" should read -- IO31 --.
Line 39, "BLKO" should read -- BLK0 --.
Line 41, "OISA31" should read -- IOSA31 --.
Line 47, "input-output" should read -- input/output --.

Column 4,
Line 51, "OISA31" should read -- IOSA31 --.
Line 56, "MUXO" should read -- MUX0 --.

Column 5,
Line 2, "MDQO" should read -- MDQ0 --.
Lines 11-12, "TG ITG4" should read -- TG1~TG4 --.
Line 25, "DI" should read -- D1 --.
Line 26, "IOSAI" should read -- IOSA1 --.

UNITED STATES PATENT AND TRADEMARK OFFICE
CERTIFICATE OF CORRECTION

PATENT NO. : 6,323,664 B1
DATED : November 27, 2001
INVENTOR(S) : Kim et al.

It is certified that error appears in the above-identified patent and that said Letters Patent is hereby corrected as shown below:

<u>Column 6,</u>
Line 8, "arc" should read -- are --.
Line 65, "arepresentative" should read -- a representative --.

Signed and Sealed this

Twelfth Day of November, 2002

Attest:

Attesting Officer

JAMES E. ROGAN
*Director of the United States Patent and Trademark Office*